United States Patent
Lieber et al.

(10) Patent No.: US 6,190,634 B1
(45) Date of Patent: Feb. 20, 2001

(54) CARBIDE NANOMATERIALS

(75) Inventors: Charles M. Lieber, Lexington; Hongjie Dai, Cambridge, both of MA (US)

(73) Assignee: President and Fellows of Harvard College, Cambridge, MA (US)

(*) Notice: Under 35 U.S.C. 154(b), the term of this patent shall be extended for 0 days.

(21) Appl. No.: 08/477,080

(22) Filed: Jun. 7, 1995

(51) Int. Cl.[7] .................. D01F 9/08; D01F 9/12
(52) U.S. Cl. ............ 423/439; 423/440; 423/447.2; 423/414; 428/366; 428/367
(58) Field of Search .................. 423/439, 440, 423/445 B, DIG. 39, DIG. 40, 447.2, 414; 428/366, 367

(56) References Cited

U.S. PATENT DOCUMENTS

| | | | |
|---|---|---|---|
| 3,246,950 | 4/1966 | Gruber | 423/346 |
| 3,447,952 | 6/1969 | Hertl | 423/439 |
| 4,900,525 | 2/1990 | D'Angelo et al. | 423/345 |
| 4,904,622 | 2/1990 | Dubots et al. | 423/345 |
| 4,948,573 * | 8/1990 | Nadkarni | 423/439 |
| 4,988,564 | 1/1991 | D'Angelo et al. | 428/367 |
| 5,221,526 | 6/1993 | Qi et al. | 423/345 |

FOREIGN PATENT DOCUMENTS

| | | |
|---|---|---|
| 0 400 656 A1 | 5/1990 | (EP). |
| 0 582 435 A1 | 2/1994 | (EP). |
| 0 603 888 A2 | 6/1994 | (EP). |
| 2-175698 | 7/1990 | (JP). |
| 5-221799 | 8/1993 | (JP). |
| WO 89/07163 | 8/1989 | (WO). |
| WO 96/30570 | 10/1996 | (WO). |

OTHER PUBLICATIONS

Zhou et al., Chemical Physical Letters 222:233–238, (May 13, 1994).

Stephen et al., Science 266:1683–1685, (Dec. 9, 1994).

Weng–Sieh, Physical Review B: Rapid Communications 51:11229–11232, (Apr. 15, 1995).

Ebbesen et al., "Large–scale Synthesis of Carbon Nanotubes", *Nature* 358, 220–222 (1992).

Hamilton et al., "Prpearation of Amorphous Boron Nitride and Its Conversion to a Turbostratic, Tubular Form", *Science* 260, 659–661 (1993).

Iijima, "Helical Microtubules of Graphitic Carbon", *Nature* 354, 56–58 (1991).

McMahon et al., "On the Growth Mechanism of Silicon Carbide Whiskers", *Journal of Materials Science* 26, 5655–5663 (1991).

Ruoff et al., "Single Crystal Metals Encapsulated In Carbon Nanoparticles", *Science* 259, 346–348 (1993).

Stephan et al., "Doping Graphitic and Carbon Nanotube Structures with Boron and Nitrogen", *Science* 266, 1683–1685 Dec. 9, (1994).

Wokulski et al., "On the Growth and Morphology of Tic$_x$ Whiskers", *Journal of Crystal Growth* 62, 439–446 (1983).

Zhou et al., "Production of Silicon Carbide Whiskers From Carbon Nanoclusters", *Chemical Physical Letters* 222, 233–238 May 13, (1994).

Weng–Sieh, Phys. Rev. B., vol. 51, #16, pp 11229–11232 (Apr. 15, 1995).*

* cited by examiner

Primary Examiner—Steven P. Griffin
Assistant Examiner—Peter DiMauro
(74) Attorney, Agent, or Firm—Fish & Richardson P.C.

(57) ABSTRACT

A nanoscale carbide article consisting essentially of covalently bounded elements $M^1$, $M^2$, and C having the molar ratio $M^1:M^2:C::1:y:x$, wherein the article has an aspect ratio of between 10 and 1000 and has a shorter axis of between 1 and 40 nanometers.

2 Claims, No Drawings

US 6,190,634 B1

CARBIDE NANOMATERIALS

STATEMENT AS TO FEDERALLY SPONSORED RESEARCH

This invention was made with support from the National Science Foundation (MERSEC, Grant No. DMR-9400396). Accordingly, the U.S. government may have certain rights in the invention.

BACKGROUND OF THE INVENTION

The invention is in the field of nanometer scale materials.

Examples of nanomaterials include hollow carbon graphite tubes with diameters between 1 and 75 nm, and lengths up to one micron. Such nanotubes are produced, for example, in reactors at 550–850° C. by mixing hydrogen and carbon-containing gases in the presence of a catalyst. Strategies used to prepare filled nanotubes include in-situ arc growth using metal/carbon composites and the loading of nanotubes using liquid reagents. In addition, graphitecoated, partially-hollow lanthanum carbide particles with overall diameters between 20 and 40 nm have been made.

In contrast to nanoscale materials, whiskers are crystalline solid structures generally having diameters between 1–100 microns, although diameters as small as 0.1 microns have been observed.

SUMMARY OF THE INVENTION

The invention features a carbide article consisting essentially of covalently bonded elements $M^1$, $M^2$ and C having the molar ratio $M^1:M^2:C::1:y:x$. The first element $M^1$ is selected from the first element group consisting of titanium, silicon, niobium, iron, boron, tungsten, molybdenum, zirconium, hafnium, vanadium, tantalum, chromium, manganese, technetium, rhenium, osmium, cobalt, nickel, a lanthanide series element, scandium, yttrium, and lanthanum. The second element $M^2$ is selected from a second element group consisting of nitrogen, boron, phosphorus, zinc, aluminum, copper, germanium, cadmium, indium, tin, lead, thallium, and the elements in the first element group, provided that the first and second elements are not the same. The value of y is between 0 and 0.9 (e.g., y is 0 or y is between 0.1 and 0.9). The third element C is $sp^3$ hybridized carbon, and the value of x is between 0.1 and 2.1 (e.g., between 0.9 and 1.1). The article has an aspect ratio of between 10 and 1000 (e.g., between 50 and 500, or between 100 and 1000), and has a shorter axis of between 1 and 40 nanometers (e.g., between 1 and 30 nm).

In certain embodiments, the article has a single crystal structure, a polycrystalline structure, or an amorphous structure. Preferably, element $M^1$ is selected from the group consisting of titanium, silicon, niobium, iron, boron, tungsten, molybdenum, or gadolinium, or from the group consisting of titanium and silicon. Preferably, second element $M^2$ is selected from the group consisting of boron and nitrogen, wherein y is greater than 0 (e.g., between 0.1 and 0.9). In one aspect, the article is a nanorod.

The nanoscale carbide articles of the invention are useful materials having metallic, semiconducting, insulating, superconducting, or magnetic properties, or a combination thereof. The novel dimensions of the disclosed articles permit the building of nanostructures and superior metallic, ceramic, and polymer composites. For example, the tensile strength (kg/mm$^2$) of the disclosed nanorods is greater than that of the corresponding whisker. Some embodiments have a lower density of stacking faults, as measured by TEM and normalized to diameter, than prior larger materials. For example, SiC nanorods disclosed herein have a lower density of stacking faults than the SiC whiskers as described by G. McMahon et al., *J. Mater. Sci.* 26:5655–5663 (1991). The invention encompasses not only the individually identified carbide articles, but also other nanoscale materials that are made according to processes disclosed herein. The invention also encompasses the methods disclosed herein for making carbide articles such as nanorods.

Other features or advantages of the present invention will be apparent from the following detailed description of the invention, and also from the appending claims.

Terms

As used herein, the term "carbide" means a compound of carbon and one or two elements more electropositive than carbon, excluding hydrogen. The atoms in a carbide are covalently bound, the carbon atoms being generally $sp^3$ hybridized as in $Ta_2C$ and $Cr_3C_2$. In contrast, pure graphitic carbon (e.g., nanotube starting material) is $sp^2$ hybridized. Examples of binary carbides include $TiC_x$, $NbC_x$, and $SiC_x$ (wherein x is between 0.5 and 1.1), $Fe_3C_x$ (wherein x is between 0.8 and 1.2), and $BC_x$ (wherein x is between 0.1 and 0.3). Additional examples of binary carbides include $ZrC_x$, $HfC_x$, $VC_x$, $TaC_x$, $CrC_x$, $MoC_x$, $WC_x$, $NiC_x$, $LaC_x$, $CeC_x$, $PrC_x$, $NdC_x$, $SmC_x$, $GdC_x$, $DyC_x$, $HoC_x$, $ErC_x$, and $YbC_x$. Examples of ternary carbides include carbonitrides, carboborides, and carbosilicides and others such as $TiN_yC_x$, $MoN_yC_x$, and $SiN_yC_x$, $TiB_yC_x$, $TiTa_yC_x$, $TiSi_yC_x$, $TiNb_yC_x$, $MoSi_yC_x$, $MoB_yC_x$, $MoGa_yC_x$, $MoAl_yC_x$, $FeB_yC_x$, $FeSi_yC_x$, $FeNi_yC_x$, $SiB_yC_x$, $TaSi_yC_x$, $WSi_yC_x$, $ZrSi_yC_x$, $NbSi_yC_x$, $CrSi_yC_x$, $NdB_yC_x$, and $WCo_yC_x$. The values of x and y are, respectively, between 0.1 and 2.1 and between 0 and 0.9. Where y is 0, the carbide is a binary carbide consisting essentially of carbon and $M^1$ having the formula ratio of $M^1C_x$. Where y is greater than 0 (e.g., between 0.1 and 0.9), the carbide is a ternary carbide consisting essentially of carbon, $M^1$, and $M^2$ having the formula ratio $M^1M^2_yC_x$.

As used herein, the term "article" includes nanorods, sheets, cages, shaped forms, and irregular crystalline or amorphous forms, such as dendritic or starburst forms. An article, such as a sheet, may be substantially planar, wavy, corrugated, or helical. An article may have one or more pores, grooves, or other textured topology.

As used herein, the term "nanorod" means a space-filling article with an aspect ratio of at least 10 (e.g., at least 50, at least 100, or at least 500). In general, the aspect ratio is between 25 and 1000, (e.g., between 100 and 1000, between 50 and 500, between 100 and 500, or between 500 and 1000). A nanorod has a shorter axis of between 0.1 and 80 nm (e.g., between 1 and 40 nm, and preferably between 2 and 30 nm). In other words, the length of a nanorod is between 0.02 and 50 µm, and preferably between 0.5 and 25 µm. The disclosed nanorods are solid, being neither hollow with one or two open ends, nor hollow with two sealed ends.

There may be impurities in or on the carbide lattice material such as oxygen (up to 10%), halogen (up to 2%), silicon (up to 5%), tellurium (up to 1%), and $SP_2$ hybridized carbon (up to 5%). The sources of these impurities are typically the reactants (metal oxide, transport molecules and transport agents) used in forming volatile metal and nonmetal species. These impurities are covalently bonded within the lattice, covalently bonded to or physically adsorbed to the surface of the nanorod, or located in interstitial sites (caged) within the lattice. In some embodiments, the presence of some impurities is desirable. For example, the presence of silicon is desirable to enhance or impart greater strength or fracture resistance for applications in intercombustion engines and gas turbines. It is believed that the term "consisting essentially of" allows for the above-described impurities.

As used herein, the term "short axis" is equivalent to "diameter," meaning the shortest dimension or cross-sectional thickness of a nanorod. Where a nanorod is, e.g., helical or networked, the diameter is always measured across the thickness of the rod, and not the overall diameter of the helix or the network, which is generally much greater than the diameter of the nanorod. In general, the diameter of a nanorod is substantially the same along the length of the nanorod. In some embodiments, a nanorod may have pores, grooves, or a fluctuating diameter (in an embodiments with a fluctuating diameter, the diameter is the average diameter).

As used herein, the term "length" means a longitudinal dimension (or approximation) of the nanorod that is orthogonal to the diameter of the nanorod. Length is not the overall size of a helix or overlapping network, which (if made of only one nanorod) is generally shorter than the length of the nanorod. If a helix or network is made of more than one nanorod, the length of a nanorod may be larger or smaller than the overall length of the helix or network.

DETAILED DESCRIPTION OF THE INVENTION

The invention is based, in part, on the discovery that carbon nanotubes are essentially completely converted to solid, covalently bound binary (or ternary) carbide nanorods. Conversion of nanotubes to carbide materials is essentially complete. In general, greater than 70% and typically 80% of the carbide materials are nanorods (having an aspect ratio of at least 10 and a diameter between 1 and 40 nm), the remaining 20% being carbide materials having aspect ratios less than 10, i.e., closer to particulates. Typically, the nanorod products have been shown to consist of at least 90% (and generally 95%) $sp^3$ hybridized carbon and the designated metal or nonmetal elements $M^1$ and $M^2$, the remaining 5–10% being impurities such as oxygen, silicon, halogen, or tellurium, or combinations thereof.

The disclosed nanorods have the formula ratio $M^1M^2_yC_x$, and a diameter of between 1 and 40 nm and an aspect ratio of between 10 and 1000. The diameter of the nanorods can be controlled in large part by the carbon nanotube precursor. In some embodiments that contain silicon, the diameter of the product increases slightly. This increase can be minimized by reducing reaction time.

Element $M^1$ is selected from the first element group consisting of titanium, silicon, niobium, iron, boron, tungsten, molybdenum, zirconium, hafnium, vanadium, tantalum, chromium, manganese, technetium, rhenium, osmium, cobalt, nickel, a lanthanide series element (i.e., cerium, praseodymium, neodymium, promethium, samarium, europium, gadolinium, terbium, dysprosium, holmium, erbium, thulium, ytterbium, and lutetium), scandium, yttrium, and lanthanum. Preferred $M^1$ are titanium, silicon, niobium, iron, boron, gadolinium, tungsten, molybdenum, zirconium, hafnium, vanadium, tantalum, and chromium.

Element $M^2$ is selected from the group consisting of nitrogen, boron, phosphorus, zinc, aluminum, copper, germanium, cadmium, indium, tin, lead, thallium, and the elements in the first element group (i.e., titanium, silicon, niobium, iron, boron, tungsten, molybdenum, gadolinium, zirconium, hafnium, vanadium, tantalum, chromium, manganese, technetium, rhenium, osmium, cobalt, nickel, cerium, praseodymium, neodymium, promethium, samarium, europium, terbium, dysprosium, holmium, erbium, thulium, ytterbium, lutetium, scandium, yttrium, and lanthanum). Preferred $M^2$ are selected from nitrogen and boron.

The ratio x of carbon to $M^1$ in a binary carbide ($M^1C_x$) or a ternary carbide ($M^1M^2_yC_x$) is between 0.1 to 2.1. Where $M^1$ is Ti, Zr, or Hf, x is preferably between 0.5 and 1.1, and more preferably between 0.9 and 1.1 (i.e., stoichiometric). Where $M^1$ is V, Nb, or Ta, x is preferably between 0.7 and 2.1. Other preferred ratios are as follows: Mo and W (0.6–2.1); Cr and Mn (0.2–0.7); Tc, Re, and Os (0.7–1.1); Fe, Co, and Ni (0.2–0.5); lanthanide elements such as Gd, Dy, and Yb (0.5–1); and B (0.1–0.3). The value for y is between 0 and 0.9, y being 0 in binary carbides. Stoichiometric carbide nanorods have enhanced conductivity and lower chemical reactivity, due to fewer carbon vacancies.

The properties of the disclosed, highly anisotropic nanorods are determined in numerous ways known to those in the art. These methods include transmission electron microscopy (TEM) to measure stacking fault density; energy-dispersive X-ray fluorescence to measure presence of nonmetals, metals, and impurities having a mass greater than or equal to sodium; electron energy loss spectroscopy to measure the hybridization of carbon; powder X-ray diffraction (XRD) to measure the crystal lattice structure; and convergent beam electron diffraction to measure lattice symmetry or the lattice constant a (Å).

The nanorods are also characterized by crystal structure (amorphous, polycrystalline, or single crystal). The crystal structure can be affected, in part, by the temperature and time of reaction. First, amorphous carbide materials are generally obtained at low reaction temperatures, e.g., below 1000° C. or even below 500° C. Second, polycrystalline materials are generally obtained under conditions where: (i) nucleation of the carbide occurs at multiple uncorrelated sites along the carbon reactant (e.g., nanotube) and (ii) there is insufficient energy or time for the uncorrelated crystalline domains to rearrange into a single crystal structure. Nevertheless, temperatures required to produce polycrystalline materials are always higher than temperatures required to produce an amorphous phase of the same carbide.

Third, single crystal materials are generally obtained when nucleation of the carbide occurs at a single site (e.g., an end of a carbon nanotube), and the growth of the carbide phase spreads outward from this single site. Alternatively, it is possible for a polycrystalline material to rearrange into a single crystal material at temperatures sufficiently high to promote diffusion and atomic rearrangement. A single crystal material consists of a single domain which may have few defects (high quality single crystal) or many defects (low quality single crystal). In general, the radial composition for single crystal nanorods are uniform; however, the invention encompasses nonuniform radial doping in nanorods. While essentially straight nanorods are preferred, the invention also encompasses straight, helical, crosslinked, and networked geometries made of one or more nanorods.

On the one hand, the disclosed articles generally retain the qualitative properties of the corresponding bulk carbide. For example, a NbC nanorod has superconductive properties, and a $Fe_3C$ nanorod has magnetic properties (see Examples 3 and 5, respectively). On the other hand, compared with large carbide whiskers, the disclosed nanorods have a increased surface-to-volume ratio, which improves mechanical strength (e.g., tensile strength) and chemical reactivity.

Methods known in the art of measuring tensile strength are designed for existing fibers or whiskers, which are much larger than the disclosed nanorods. Therefore, a novel procedure is necessary for measuring the tensile strength of nanorods, such as using an atomic force microscope to apply known loads to a nanorod until it fractures or plastically deforms. A linear extrapolation based on T. Takahashi, *J. Electrochem. Soc.* 117:541 (1970) suggests that the tensile strength of nanorods is over ten times that of the corresponding whisker (10 microns in diameter), and possibly as much as 8000 times greater.

Synthesis

The nanorods disclosed herein are synthesized by the reaction of carbon nanotubes with a volatile metal or nonmetal species. In general, the reaction is carried out under static conditions in a sealed quartz tube with the reaction temperature dictated by the gas-phase transport of the oxide/halide reactants and carbide growth (see Examples 1–5). The carbon nanotube reactants need not be anchored or tensed in any way to produce essentially straight nanorod products. Reaction temperatures are generally between 500 and 2500° C., and preferably between 600 and 1700° C. In general, the reaction can be monitored by measuring the conversion of carbon nanotube to carbide article and the structure of the carbide article.

The carbon nanotube reactants used in these vapor-solid reactions were obtained from metal-catalyzed growth using ethylene and hydrogen, adapted from C. E. Snyder et al. WO 89/07163 (1989), or are commercially available from Hyperion Catalysis International, Lexington Mass. This procedure yields relatively pure nanotube samples compared with arc-discharge methods, although some nanotubes exhibit poor crystallinity. Alternatively, nanotubes may be prepared by arc discharge procedures as described, for example, by S. Iijima, *Nature* 354:56–58 (1991), T. W. Ebbesen and P. M. Ajayan, *Nature* 358:220–222 (1992), and D. T. Colbert et al. *Science* 266:1218–1222 (1994).

In general, it is preferred to use nanotubes having fewer carbon defects. A defect includes any irregularity or nonstoichiometery in the crystal structure, such as a missing carbon atom (vacancy), a missing carbon—carbon bond (dislocation), or a stacking fault. Defects can be repaired or minimized by annealing the nanotubes in an inert (e.g., He or Ar) atmosphere at temperatures exceeding 1400° C. and preferably between 1400 and 2000° C. Annealing not only repairs defects but also improves both straightness and crystallinity of the graphitic nanotubes, which are generally highly curved.

Turning to the source of a metal or nonmetal, an important consideration is the volatility of the material under the chosen reaction conditions. A volatile metal or nonmetal oxide species (source of $M^1$, and $M^2$ if present) is obtained by combining commercially-available reagents selected from the group consisting of a pure metal or nonmetal, a metal or nonmetal oxide, a halogen transport molecule, and a halogen transport agent. At least one mole equivalent, and generally between 2 and 10 mole equivalents, of a metal or nonmetal reactant is used.

A carbon source (e.g., nanotube) is reacted with, for example, (i) a pure transition metal and a halogen transport molecule selected from the group consisting of $I_2$, $Br_2$, $Cl_2$ or a transport agent such as $TeCl_4$, or (ii) a metal or nonmetal oxide and a halogen transport agent to form a binary carbide. Ternary carbides are formed from two corresponding metal or nonmetal reagents, such as a pure metal or nonmetal, a halogen transport molecule, and a nitrogen source such as $N_2$ or $NH_3$. Transition metals are generally not sufficiently volatile under reaction conditions, but will form volatile complexes with the above-described halogen reagents. In addition, the transport agent $TeCl_4$ forms volatile species with most nonvolatile oxides, including $MnO_2$ and $MoO_2$. Some reactants are generated in situ, such as $B_2O_2$, which was generated in situ by heating elemental boron and $TiO_2$ powder. Specific examples of such reagents include $TiO$, $I_2$, $B_2O_2$, $FeCl_3$, and $SiO$. Additional examples and guidance are found in H. Schafer, *Angew. Chem. Int. Ed., Engl.* 10:43–50 (1971). Commercially-available reagents generally do not require pre-treatment before use, since their purity is typically $\geq 99\%$. Commercial sources include Aldrich Chemicals, Milwaukee, Wis., and Johnson-Mathey, Ward Hill, Mass.

Examples of binary carbides include $ZrC_x$, $HfC_x$, $VC_x$, $TaC_x$, $CrC_x$, $MoC_x$, $WC_x$, and $NiC_x$ (formed, e.g., by reaction of pure metal and halogen transport molecule with a carbon source); and $LaC_x$, $CeC_x$, $PrC_x$, $NdC_x$, $SmC_x$, $GdC_x$, $DyC_x$, $HoC_x$, $ErC_x$, and $YbC_x$ (formed, e.g., by reaction of metal oxide and halogen transport agent with a carbon source). Examples of ternary carbides include $TiN_yC_x$, $MoN_yC_x$, and $SiN_yC_x$ (formed, e.g., by reaction of pure metal/nonmetal, halogen transport molecule, and nitrogen or ammonia with a carbon source); $TiB_yC_x$, $TiTa_yC_x$, $TiSi_yC_x$, $TiNb_yC_x$, $MoSi_yC_x$, $MoB_yC_x$, $MoGa_yC_x$, $MoAl_yC_x$, $FeB_yC_x$, $FeSi_yC_x$, $FeNi_yC_x$, $SiB_yC_x$, $TaSi_yC_x$, $WSi_yC_x$, $ZrSi_yC_x$, $NbSi_yC_x$, $CrSi_yC_x$, and $WCo_yC_x$ (formed, e.g., by reaction of metal and halogen transport molecule with a carbon source); and $MoSi_yC_x$, $WSi_yC_x$, $ZrSi_yC_x$, $NbSi_yC_x$, $CrSi_yC_x$, $WCo_yC_x$, $NdB_yC_x$, and $FeNd_yC_x$ (formed, e.g., by reaction of metal oxide and halogen transport agent with a carbon source).

Without intending to be bound, it is believed that the mechanism involves template-mediated growth, whereby carbon nanotubes define the diameter of the product carbide nanorods formed following reaction with a volatile species. This is supported by the similarity of the average nanorod diameters (and morphologies in the case of polycrystalline NbC) to that of the starting nanotubes. Catalytic growth and/or sintering of small nanotubes may also be involved. In principle, template mediated growth will produce carbide nanorods of any stable metal carbide.

Solid carbide nanorods (SiC, TiC, NbC, $Fe_3C$, and $BC_x$) have been prepared in high-yield with typical diameters between 2 and 30 nm and lengths up to $20\,\mu m$ (see Examples 1–5 below).

Use

The disclosed nanoscale articles are used in the preparation of nanostructures having a superior combination of a uniquely small size and mechanical, electrical and/or magnetic properties, suitable for electrodes in nanoscale batteries and for high density magnetic recording media. Small diameters and high aspect ratios also make the disclosed articles useful as improved reinforcements in metal, ceramic, and organic polymer matrix composites. A carbide article disclosed herein can be selected from a wide range of metal and nonmetal carbides to suit the chemical properties (e.g., resistance, reactivity) or physical properties (e.g., coefficient of thermal expansion) desired for a particular composite. Specific products include cutting tools, engineering composites such as gas turbine blades and automotive ceramics, and implantable medical devices such as artificial limbs and joints. Conductive or semi-conductive nanorods are also useful as "defects" embedded within a superconductor to pin vortices in high-temperature, high critical current density superconductor wires (e.g. copper oxide), see P. Le Doussal and D. R. Nelson, *Physica C* 232:69–74 (1994). Finally, the disclosed nanoscale articles are used in basic research to probe the effects of confinement and dimensionality in metallic, semiconducting and superconducting materials.

Without further elaboration, it is believed that one skilled in the art can, based on the description herein, utilize the present invention to its fullest extent. All patents and publications cited herein are hereby incorporated by reference. The following specific examples are, therefore, to be construed as merely illustrative, and not limitative of the remainder of the disclosure.

EXAMPLES

Example 1

Titanium carbide nanorods were made according to two different methods, Method A and Method B.

Method A. The starting mixture was composed of 20 mg of carbon nanotubes produced as described above, and a compacted, solid pellet consisting of a 10-fold molar excess of TiO powder. After sealing the starting mixture under vacuum ($1 \times 10^{-3}$ torr) in a quartz tube, the tube was placed in the center of a tube furnace equilibrated at a temperature of 1350° C. for 12 hours. Then the furnace was turned off and allowed to cool naturally to room temperature. After removing the quartz tube from the furnace and opening it to the atmosphere, the unreacted TiO powder, still in pellet form, was manually removed from the black nanorod product, which had a fine, powder-like consistency. The nanorods were poured from the quartz tube and thoroughly washed with ethanol and dried in air.

Method B. In the second method, the same procedure described in Method A was followed, except an amount of solid iodine corresponding to 1 mg $I_2$ per cm$^3$ of the quartz reaction tube was added to the tube, and the quartz tube was heated at 1200° C. for 24 hours.

The morphology and structure of the products obtained from the reaction of TiO and carbon nanotubes at 1375° C. were determined. Transmission electron microscopy (TEM) images of the reaction product revealed straight and smoothly curved, solid rod-like structures that were distinct from the irregularly curved and hollow carbon nanotube reactants. These images also showed that the diameters of the rod-like products were similar to that of the carbon nanotubes (1–30 nm), and that the lengths typically exceeded 1 μm and were measured up to 40 μm. Energy dispersive X-ray fluorescence and electron energy loss spectroscopy measurements demonstrated that these nanorods contained only titanium and sp$^3$-hybridized carbon, and thus are consistent with the complete conversion of the carbon nanotubes into titanium carbide (TiC).

This formulation was further established by structural analyses. Powder X-ray diffraction (XRD) measurements on nanorod samples produced using either TiO or Ti+$I_2$ exhibited diffraction peaks that were indexed to the known cubic, rock salt structure of TiC with no evidence of either graphitic (nanotube reactant), Ti-metal or Ti-oxide peaks present. The measured lattice constant, a=4.326 Å, was consistent with a stoichiometry TiC$_x$, x=1. TEM and electron diffraction studies of single nanorods revealed smooth, regular saw-tooth, and irregularly faceted morphologies. The TiC nanorods also appeared to be single crystals with a very low density of stacking faults. Convergent beam electron diffraction patterns recorded along the <111> zone axis perpendicular to the axis of the smooth nanorod exhibited a lattice constant and six-fold symmetry corresponding to the (111) planes of cubic TiC. These data suggested that the axis of the smooth TiC nanorods was [110] for this morphology as well. The [110] direction is not unique for the TiC nanorods. In the irregularly faceted nanorods, high-resolution TEM and electron diffraction demonstrated that the growth direction was [111], and further showed that the TiC nanorods contained single crystal domains often exceeding 1 μm in length. The saw-tooth morphology has obvious advantages for some applications (e.g., composites).

Example 2

SiC nanorods were synthesized according to two methods. In the first, the same procedure described in Method A, Example 1 was followed, except SiO powder was substituted for TiO powder, and the quartz tube was heated at 1300–1400° C. for 2 hours, then cooled to room temperature over an additional 2 hours. The silicon carbide nanorod product was blue-green.

In the second, the same procedure described in Method B, Example 1 was followed, except SiO powder was substituted for TiO powder and the quartz tube was heated at 1150° C. for 2 hours. Structural and composition analyses of the material produced from the reaction of carbon nanotubes with Si and $I_2$ were consistent with the formation of silicon carbide (SiC) nanorods. TEM images showed that the SiC nanorods produced from this reaction were relatively straight, solid rods. The diameters of the SiC rods produced in the Si+$I_2$ reaction at 1200° C. were typically 2–20 nm (similar to the diameters of the carbon nanotube reactants), with lengths around 1 μm. XRD patterns recorded on bulk samples were indexed to the zinc blended β-SiC structure and showed no evidence of other crystalline impurities. TEM images and electron diffraction data also indicated that these single crystal silicon carbide nanorods possessed a higher density of planar defects in contrast to the near single crystal TiC nanorods (see Example 1 above). For SiC nanorods with a [111] rod axis, the defects corresponded to rotational twin stacking faults; similar defects have been identified previously in much larger SiC whiskers. The rod axes lay along the [111] direction in all of the nanorods prepared at 1300–1400° C. using SiO as the volatile silicon reactant, but at the lower Si+$I_2$ reaction temperatures (1100–1200° C.) this direction was not unique. A high-resolution TEM image of one 7 nm diameter SiC nanorod produced at 1200° C. showed that the rod axis lay along the [100] direction, although small defect regions with a [111] direction were also present.

Example 3

Twenty milligrams of carbon nanotubes and a 10-fold molar excess of pelleted elemental niobium powder were sealed under vacuum ($1 \times 10^{-3}$ torr) with an amount of iodine corresponding to 1 mg/cm$^3$ volume of the quartz reaction tube. The tube was placed in the center of a tube furnace equilibrated at 750° C. for 35 hours, then cooled to room temperature in 30 minutes. The quartz tube was opened to atmosphere, and the remaining unreacted Nb was removed in pellet form. The black nanorod product was poured from the quartz reaction tube, washed thoroughly with ethanol, and then dried.

XRD showed that this reaction resulted in the complete conversion of the nanotubes into the cubic, rock salt phase of NbC. TEM images and selected area electron diffraction showed that the NbC nanorods produced in these reactions were polycrystalline with morphologies similar to the carbon nanotube starting materials. Significantly, these polycrystalline nanorods were also found to be superconducting like bulk NbC, as shown by magnetization measurements made as a function of temperature ($T_c$=9° K.). The polycrystalline structure was likely due to the low reaction temperature (750° C.), and thus it should be possible in the future to optimize the growth conditions and produce single crystal NbC nanorods by raising the reaction temperature. The present reaction conditions also yielded unique morphologies, such as helical nanorods, which are believed to result from a direct conversion of helical carbon nanotube reactants. The NbC nanorods had diameters of between 2 and 30 nm, and lengths generally greater than 1 micron.

Example 4

Twenty milligrams of carbon nanotubes and a 10-fold molar excess of anhydrous $FeCl_3$ powder were sealed under vacuum ($1 \times 10^{-3}$ torr). The tube was placed in the center of a tube furnace equilibrated at 1350° C. for 12 hours, then cooled to room temperature in 2 hours. The quartz tube was opened to atmosphere, and the remaining unreacted $FeCl_3$ was removed from the black nanorod product by repeated washing with ethanol. The black $Fe_3C$ nanorod product was poured from the quartz reaction tube was dried in air.

TEM analysis demonstrated that the solid, amorphous nanorods consisted of covalently bonded Fe and C. Magnetization measurements showed that the iron carbide nanorods were ferromagnetic. The iron carbide nanorods had diameters of between 2 and 30 nm, and lengths generally greater than 1 micron.

Example 5

Elemental boron powder and titanium dioxide powder were mixed thoroughly in a 1:1 molar ratio and placed in a crucible boat in an amount equivalent to a 10-fold molar excess relative to 20 mg of carbon nanotubes. Twenty milligrams of carbon nanotubes and the $B-TiO_2$ mixture were separately placed in a horizontal quartz tube open at both ends, and in turn, the horizontal quartz tube was placed in a horizontal tube furnace. The end of the quartz tube nearest to the $B-TiO_2$ mixture was fitted with a gas inlet through which argon gas was slowly flowed. The other end of the quartz tube (nearest to the nanotubes) was fitted with a flexible tube connected to a bubbler. The argon flow was adjusted to produce about 1 bubble/second.

After flowing argon through the quartz tube for 30 minutes to purge atmospheric gases, the furnace temperature was increased to 1400° C. over a period of 1 hour. The furnace was maintained at 1400° C. for 2 hours, turned off, and allowed to cool naturally to room temperature. The quartz tube was opened to atmosphere, and the remaining unreacted $B-TiO_2$ was removed in the crucible boat. The black nanorod product was poured from the reaction tube, washed thoroughly with ethanol, and dried.

Analysis showed the solid nanorods consisted of polycrystalline, covalently bonded boron and carbon. The boron carbide nanorods had diameters of between 2 and 30 nm, and lengths generally greater than 1 micron. In addition, the nanorods were shown to have insulating properties. Using a scanning probe microscope and modified lithography techniques, a single nanorod was contacted on one end with a gold electrode. A second movable probe electrode was contacted with the single nanorod at different points, and conductivity was measured.

OTHER EMBODIMENTS

From the above description, the essential characteristics of the present invention can be ascertained. Without departing from the spirit and scope thereof, various changes and modifications of the invention can be made to adapt it to various usages and conditions. Thus, other embodiments are also within the claims.

What is claimed is:

1. A carbide nanorod consisting essentially of TiC, NbC, $Fe_3C$, or $BC_x$ in which x is between 0.1 and 2.1, inclusive, wherein said nanorod has an aspect ratio of between 11 and 1000, and has a shorter axis of between 1 and 40 nanometers.

2. A carbide nanorod consisting essentially of covalently bonded elements $M^1$, $M^2$ and C having the molar ratio $M^1:M^2:C::1:y:x$, wherein said first element $M^1$ is tungsten, molybdenum, zirconium, hafnium, vanadium, tantalum, chromium, manganese, technetium, rhenium, osmium, cobalt, nickel, a lanthanide series element, scandium, yttrium, or lanthanum;

said second element $M^2$ is nitrogen, boron, phosphorus, zinc, aluminum, copper, germanium, cadmium, indium, tin, lead, thallium, or the elements in said first element group, in which y is between 0 and 0.9, inclusive, provided that said first and second element are not the same; and said third element C is carbon, in which x is between 0.1 and 2.1, inclusive;

wherein said nanorod has an aspect ratio of between 11 and 1000, and has a shorter axis of between 1 and 40 nanometers.

* * * * *